US008996757B2

(12) United States Patent
Thurston et al.

(10) Patent No.: US 8,996,757 B2
(45) Date of Patent: Mar. 31, 2015

(54) METHOD AND APPARATUS TO GENERATE PLATFORM CORRECTABLE TX-RX

(71) Applicant: Intel Corporation, Santa Clara, CA (US)

(72) Inventors: Paulette Thurston, North Plains, OR (US); Bruce A. Tennant, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 252 days.

(21) Appl. No.: 13/631,956

(22) Filed: Sep. 29, 2012

(65) Prior Publication Data

US 2014/0095414 A1 Apr. 3, 2014

(51) Int. Cl.
*G06F 3/00* (2006.01)
*G06F 17/50* (2006.01)

(52) U.S. Cl.
CPC .................. *G06F 17/5054* (2013.01)

USPC ........................................................... 710/36

(58) Field of Classification Search
None
See application file for complete search history.

(56) References Cited

U.S. PATENT DOCUMENTS

| 7,464,307 | B2 * | 12/2008 | Nejedlo et al. | 714/712 |
| 2013/0067127 | A1 * | 3/2013 | Hopgood et al. | 710/104 |
| 2013/0145212 | A1 * | 6/2013 | Hsu et al. | 714/27 |
| 2014/0019742 | A1 * | 1/2014 | Ma et al. | 713/100 |

* cited by examiner

*Primary Examiner* — Alan Chen
(74) *Attorney, Agent, or Firm* — Carrie A. Boone, P.C.

(57) ABSTRACT

A programmable link training and status state machine is disclosed. The programmable finite state machine includes extra states, or shadow states, which are strategically used to debug a system design or to accommodate unexpected behavior, such as when the specifications of the design change. The programmable finite state machine is thus a mechanism to design in correctable logic, enabling the logic to be corrected in silicon and used in succeeding iterations of a product line.

31 Claims, 13 Drawing Sheets

US 8,996,757 B2

METHOD AND APPARATUS TO GENERATE PLATFORM CORRECTABLE TX-RX

TECHNICAL FIELD

This application relates to improving time-to-market for new technology development, through on-die silicon repair.

BACKGROUND

Today's System-on-chip (SOC) integrated circuit designs need to comprehend new technology features from industry groups, such as the Peripheral Component Interconnect—Special Interest Group (PCI-SIG) while concurrently sharing the intellectual property (IP) with other groups within a company, when the actual IP feature definition is not fully defined.

As demand for I/O performance increases, many designs use adaptive equalization schemes with feedback controls to self-correct. While creative, such designs of that type are so finely tuned that when the silicon of the design is finally available, there is a risk that the process design target has changed, often rendering less desirable analog behavior and thereby forcing new iterations of the design in the silicon. Corrections to any analog circuitry add delays for time to market as those changes require a repeat of the design-to-process steps.

Observations have been noted that when the new technology architecture definition for high speed I/O are not completely encompassed in the design before the manufacturing specifications for the design are sent to the fabrication facility, lengthy debug efforts can occur for multiple teams. Designing to specifications defined outside the company make it challenging to discern if ones design completely encompasses all features. Pressure to quickly deliver new technology, while the architecture definition is incomplete unintentionally causes this result. The combination of these problems creates costly delays in product introduction of cutting edge technology.

High-speed interfaces such as PCI Express and wireless communication IP require hand-shaking mechanisms to ensure proper packet passing has occurred. Identifying the correct I/O settings for each device is a complex training exercise. Today, the I/O design consists largely of adaptive algorithms on-die, with the algorithms being highly dependent on transistor process characteristics available during design. This adaptive equalization circuitry is finely tuned and can be sensitive to process variations. Adjustments and ranges for the I/O signaling to be operational across various channel types can be limited. Typically, there are many knobs to adjust, yet unexpected channel characteristics may lead to a product requirement process that includes a hunt to identify the correct "knobs" to adjust for signal optimization, while the ability to adjust training transitions via a finite state machine (FSM) control is not available at the platform level, as the FSM behavior is fixed in silicon.

Interfacing a high-speed I/O device with another high-speed I/O device is less problematic when the system designer controls both devices, since parameter adjustments on both sides of the channel can be controlled. However, to interface a high-speed I/O device with externally designed circuitry is very challenging, since state machine control is locked in silicon and depends heavily on adaptive equalization algorithms. The finite state machines work in concert with signals from the receive logic that collect the transmit logic data fields. Some software interaction is also generally provided to ensure traffic is controlled while equalization is underway.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a programmable finite state machine is disclosed. The programmable finite state machine includes extra states, or shadow states, which are strategically used to debug a system design or to accommodate unexpected behavior, such as when the specifications of the design changes. The programmable finite state machine is thus a mechanism to design in correctable logic, enabling the logic to be used in succeeding iterations of a product line.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Figure 1:
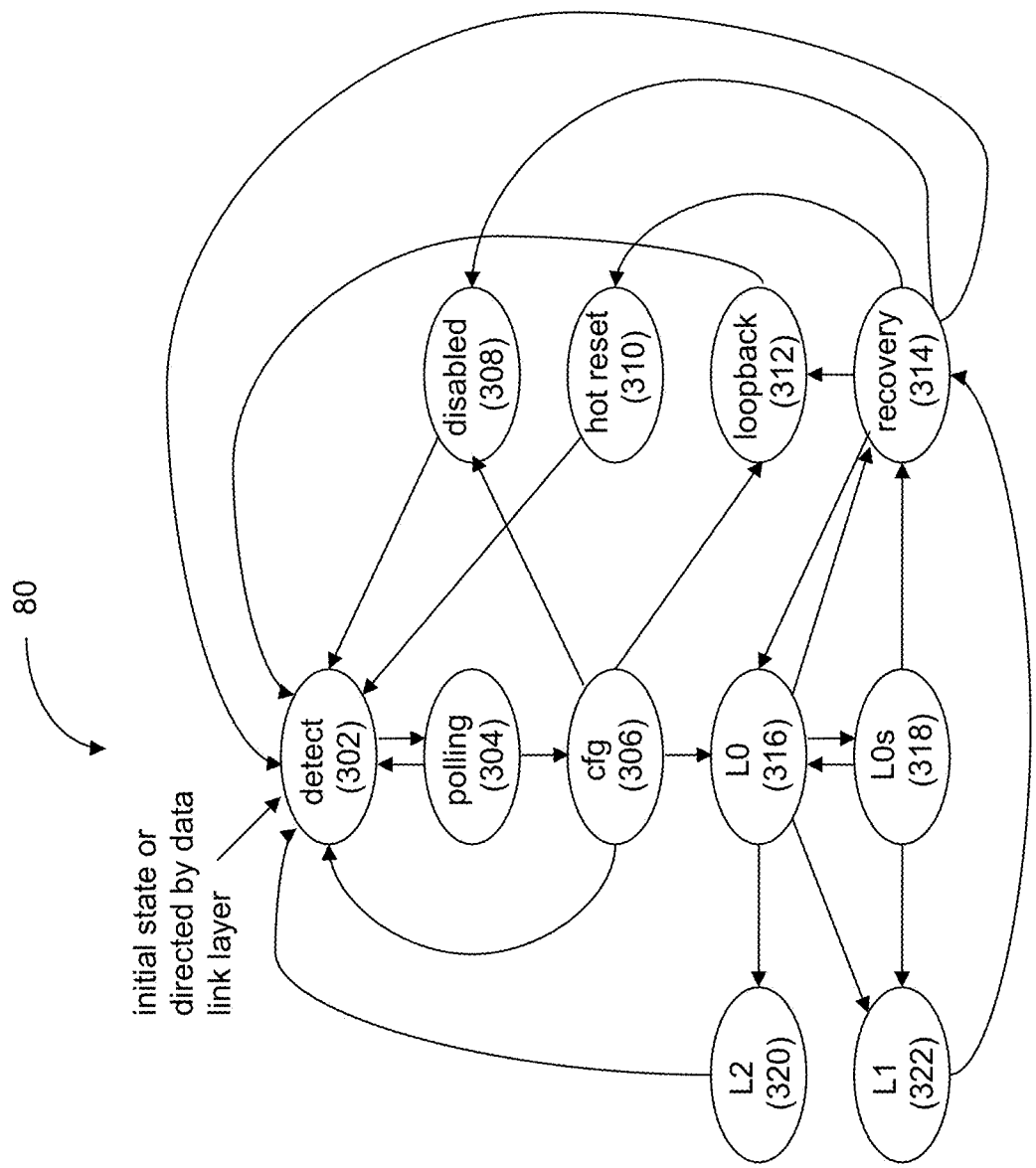
FIG. 1 is a block diagram of a link training and status state machine (LTSSM), according to some embodiments.

FIG. 1 is a diagram of a link training and status state machine, or LTSSM 80, according to some embodiments. The LTSSM 80 is the state machine used under PCIe to perform link training between two PCIe devices that are attempting to connect to one another. The LTSSM 80 includes the following states: detect 302, polling 304, configuration 306, disabled 308, hot reset 310, loopback 312, recovery 314, and power states L0 316, L0s 318, L2 320, and L1 322.

Figure 2:
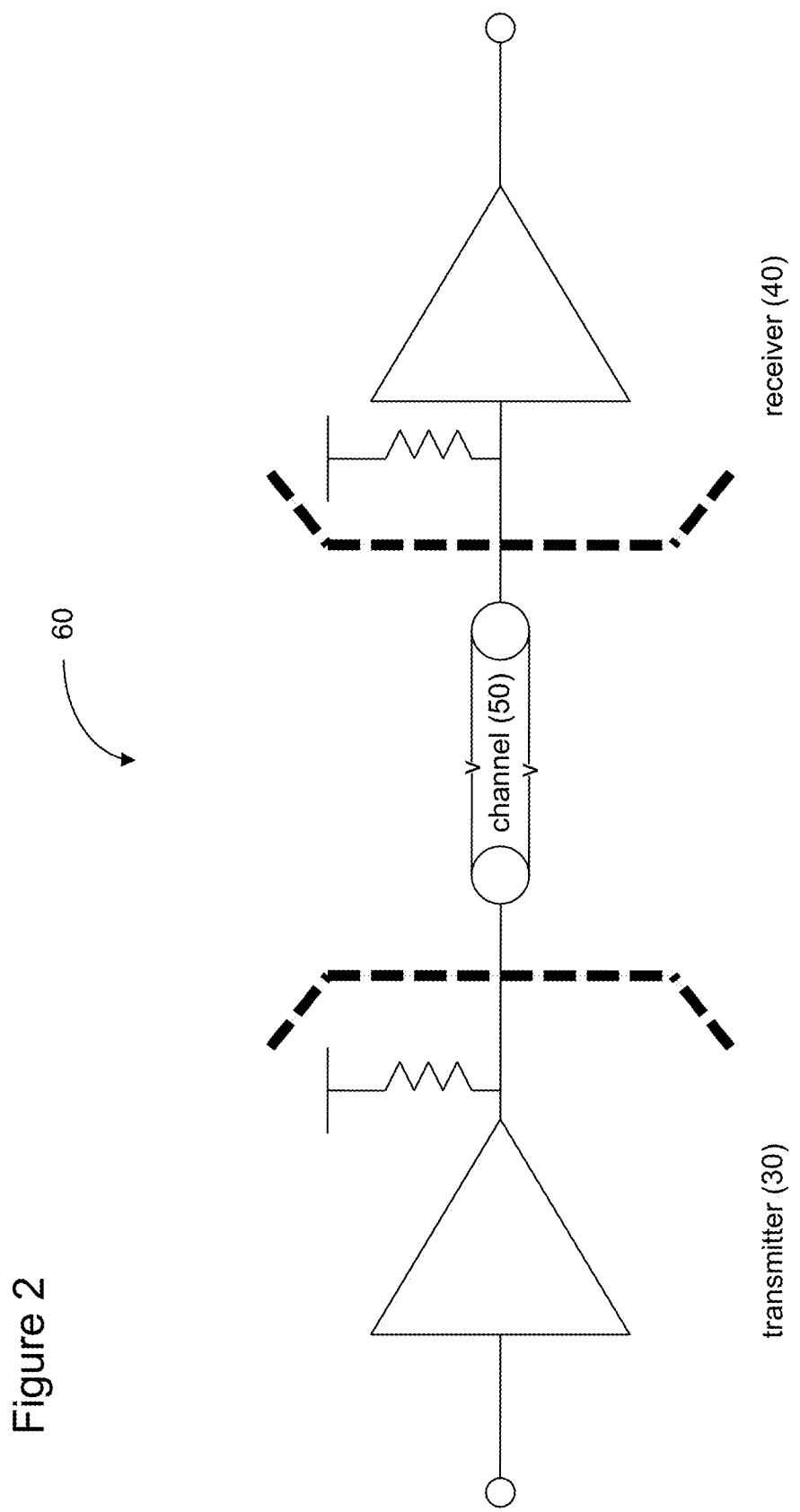
FIG. 2 is a simplified diagram of an interface between two I/O devices, according to some embodiments.

FIG. 2 is a diagram of a system 60 connecting two circuits. The first device, a transmitter 30 connects to a second device, a receiver 40, by way of a channel 50. The channel 50 characteristics vary, depending on the platform upon which the devices operate. Within each device, there exists a transmit path and a receive path. For the transmit path (within the transmitter 30), a type of equalization technique is used to modulate the signal before transmitting the signal across the channel 50 to the receiver 40. The receiver 40 contains a type of equalization technique used to recover and discern the received waveform from the channel 50.

Where the devices 30, 40 are PCIe-compliant, the LTSSM 80 of FIG. 1 may be used to perform link training between them. The two devices 30, 40 exchange training sequences to negotiate link parameters, that is, parameters for the channel 50, such as desired speed and link width. Training sequences are also used to switch the link into a low-power state.

Each device implements its own state machine (LTSSM) to control the link training. As indicated in FIG. 1, link training starts in a detect state 302. An active link that can transport transaction layer packets (TLPs) is in a state, L0 316. As is evident, the LTSSM 80 is complex, with a huge number of possible state transitions and scenarios.

Figure 3:
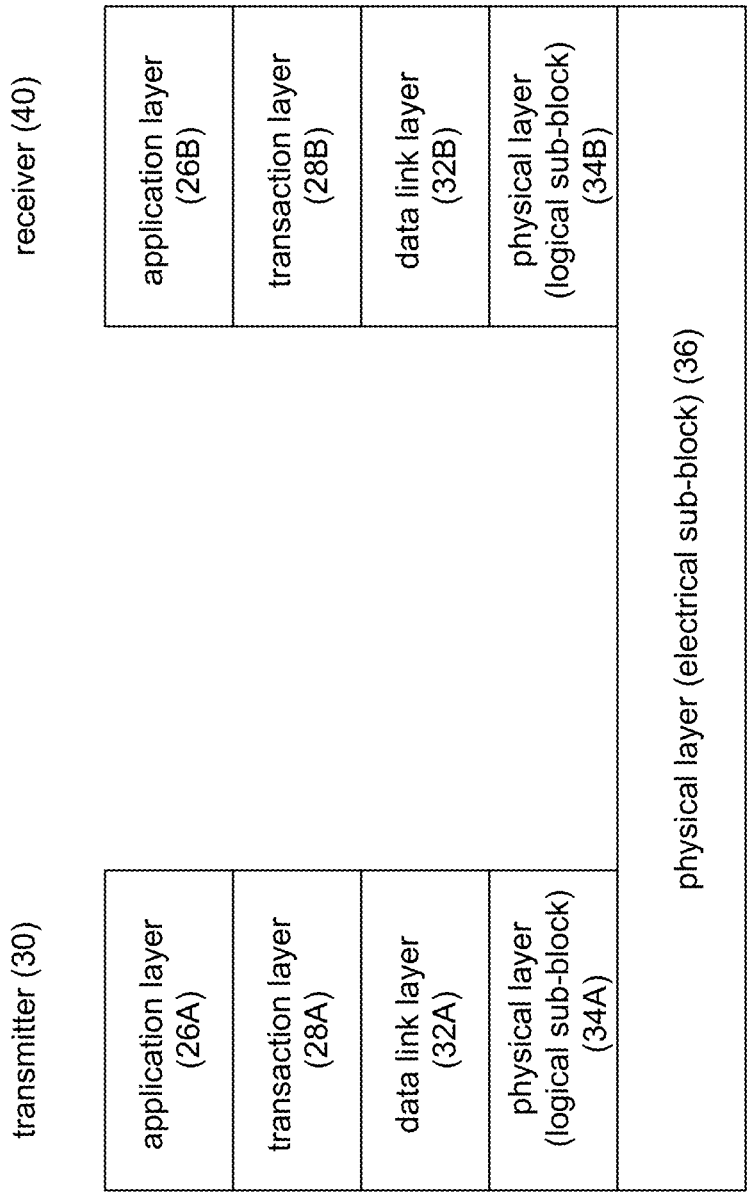
FIG. 3 is a simplified block diagram depicting the protocol layers of a PCI Express design, according to some embodiments.

FIG. 3 is a simplified block diagram showing a protocol layer stack between the transmitter 30 and the receiver 40 of FIG. 2, according to some embodiments. The transmitter 30 includes an application layer 26A, a transaction layer 28A, a data link layer 32A, and a physical layer (logical sub-block) 34A. The receiver 40 includes an application layer 26B, a transaction layer 28B, a data link layer 32B, and a physical layer (logical sub-block) 34B. The transmitter 30 and receiver 40 share a physical layer (electrical sub-block) 36.

The application layers 26A, 26B (collectively, "application layers 26") contain the high-level software operating in the transmitter 30 or receiver 40. The transaction layers 26A, 26B (collectively, "transaction layers 26") performs transaction layer packet (TLP) handling generally, and PCI protocol handling, in the case where the system 60 is a PCI-capable machine. The data link layers 28A, 28B (collectively, "data link layers 28") performs data link layer packet (DLLP) handling to control data integrity. The physical layer (logical sub-block) 34A, 34B (collectively, "physical layer 34" or "logical sub-block 34") includes a logical sub-block primary logic unit (PLU), while the physical layer (electrical sub-block) 36 includes an analog front-end (AFE). The physical layer 36 contains logic that controls and communicates with analog circuitry of the system 60.

The logical sub-blocks 34 performs 8- and 10-bit decoding, link training, power management, and data scrambling, as well as other operations. The electrical sub-block 36 includes receiver logic and transmitter logic. The LTSSM 80 (FIG. 1) resides in the logical sub-blocks 34 of both the transmitter 30 and the receiver 40. The AFE located in the electrical sub-block 36 includes a power amplifier (for the transmitter 30), for boosting an outgoing signal, and a low noise amplifier (for the receiver 40), among other components.

Figure 4:
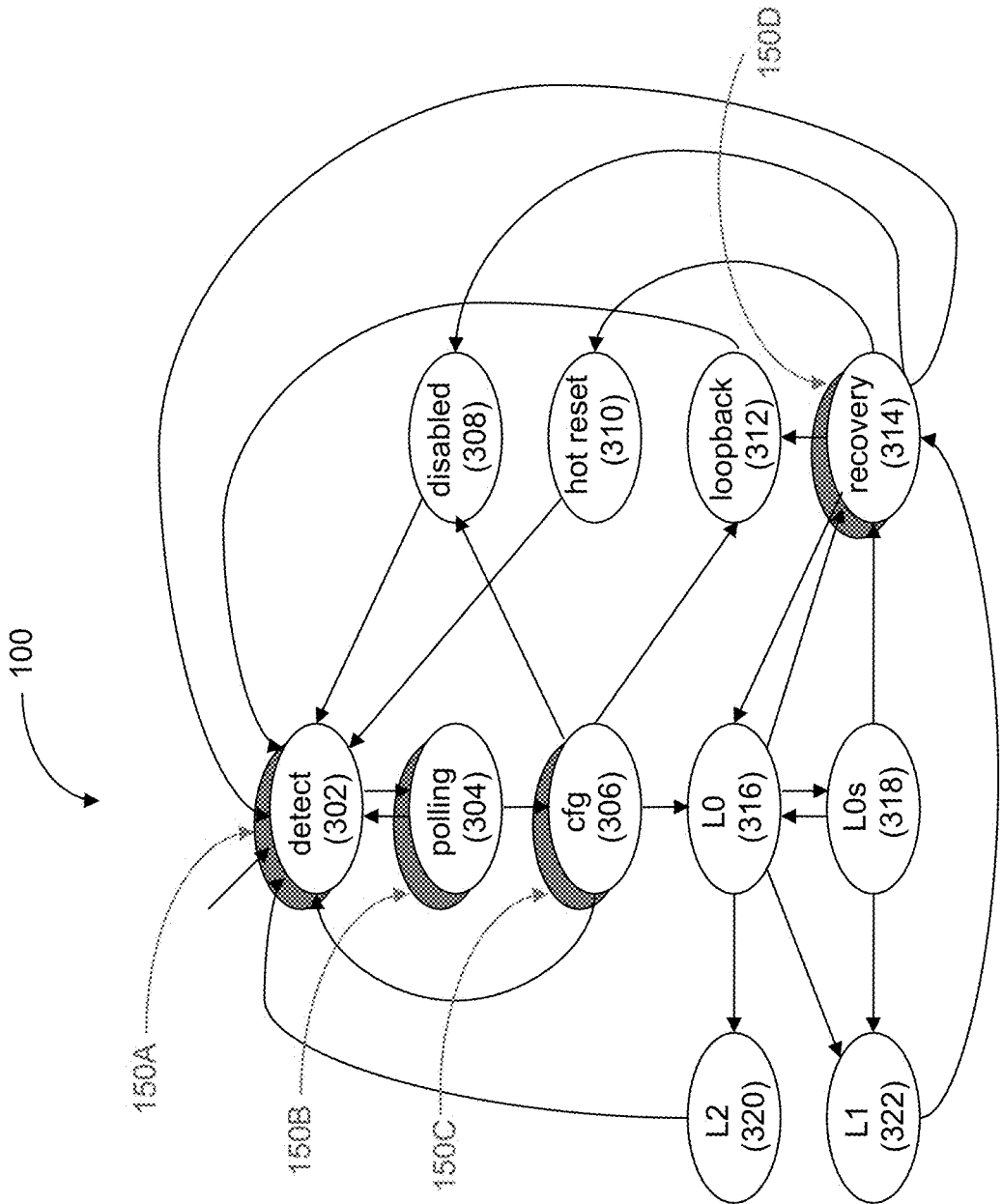
FIG. 4 is a diagram of a programmable LTSSM, according to some embodiments.

FIG. 4 is a diagram of a programmable LTSSM 100, according to some embodiments. The programmable LTSSM 100 differs from the LTSSM 80 of FIG. 1 in that the detect 302, polling 304, configuration 306, and recovery 314 states include corrective logic in the form of shadow states 150A, 150B, 150C, and 150D, respectively (collectively, "shadow states 150"), to address some issues found during system-level designs. As is described further below, using the corrective logic, the programmable LTSSM 100 is able to switch the detect state 302 to the shadow detect state 150A, the polling state 304 to the shadow polling state 150B, the configuration state 306 to the shadow configuration state 150C, and the recovery state 314 to the shadow recovery state 150D.

In some embodiments, the programmable LTSSM 100 described herein resides in the logical sub-block 34, while the analog portion being affected by changing one of the states to a shadow state 150 is in the electrical sub-block 36, or, more precisely, in the analog front-end of the physical layer. The AFE is able to adjust an I/O eye opening and adaptive analog circuitry.

In some embodiments, the programmable LTSSM 100 improves the time-to-market of new high-speed I/O technologies. Referring again to FIG. 2, the programmable LTSSM 100 disclosed herein may be part of the transmitter 30 or the receiver 40 of the system 60.

Figure 5:
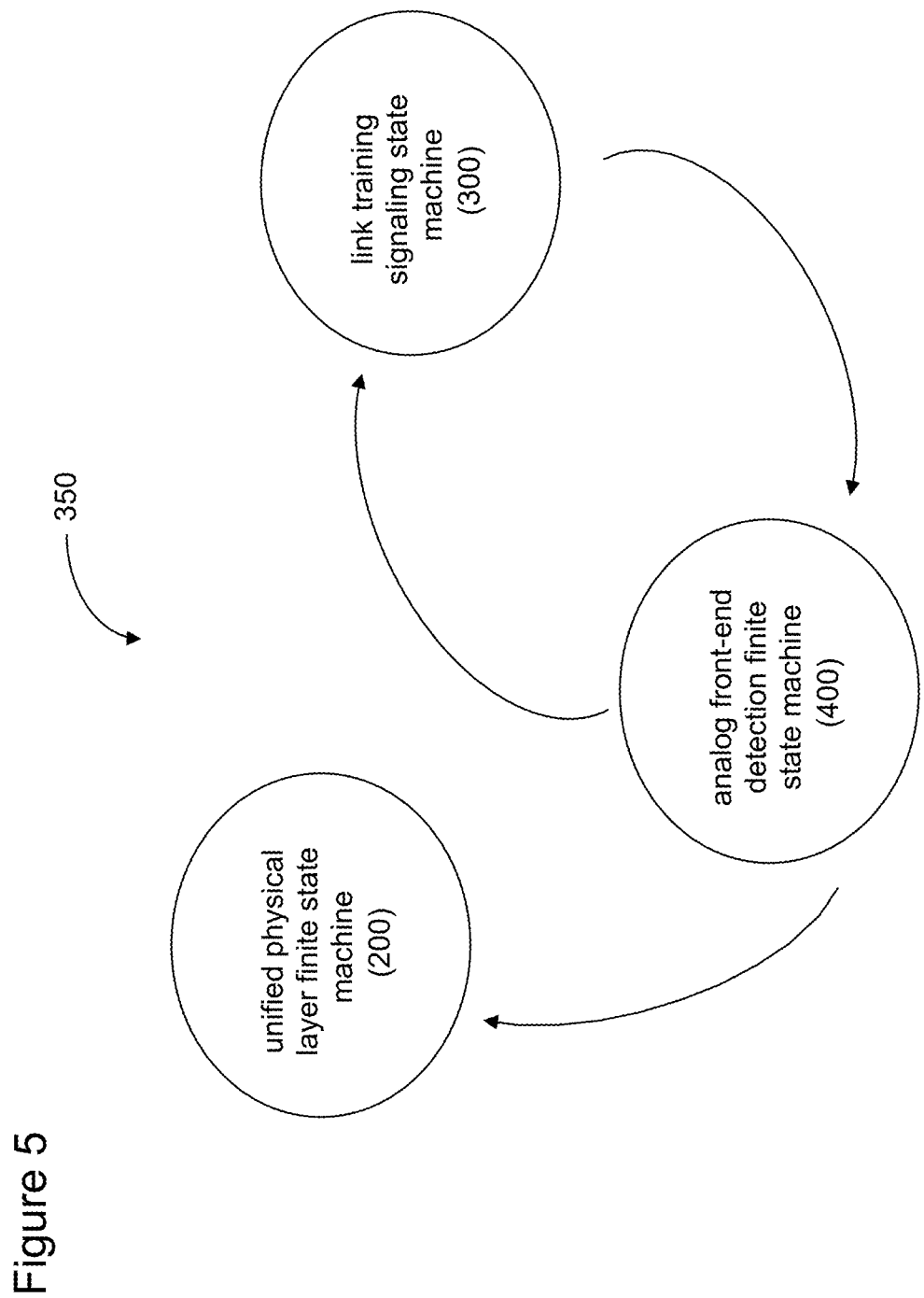
FIG. 5 is a simplified diagram of a circuit showing dependencies between three different finite state machines, according to some embodiments.

FIG. 5 is a representative system 350 showing the dependencies between three different finite state machines that characterize a typical logic and circuit design, according to some embodiments. The system 350 consists of a unified physical (PHY) layer finite state machine (FSM) 200, a link training and status FSM 300, and an analog front-end detection FSM 400. The system 350 may be part of the transmitter 30 or receiver 40 of the system 60 in FIG. 2, for example. The system 350 shows the dependency between the link training and status FSM 300, the analog front-end detection FSM 400, and the unified physical layer FSM 200. The handshake between the logic/circuit domains tends to be weakly defined when new technology is being developed and especially at risk when the architecture definition of new technology is developed in parallel with the new design.

In general, a finite state machine includes some form of logic, which may be programmable, that defines certain conditions, signaling, events, and so on, that are to occur at different states within the FSM. Here, both physical and logical states are potentially interconnected in a specific manner to perform predefined actions in response to conditions/inputs/triggers. A state within a FSM may define register usage/values, provide programmable counters, generate a signaling protocol, or perform any other hardware, firmware, software, or combinatorial action.

For example, in a first state, the FSM may simply increment a counter to determine how long the FSM resides in the first state. Then, upon occurrence of a condition, such as receiving a specific data pattern over a link, the FSM may transition to a configuration state, which initiates a signaling protocol from the FSM to a transmitter or receiver, update register values, reset counters, drive other signals to a predefined level, and so on. Therefore, usage of state logic, in some embodiments, refers to an ability of the logic to define and to perform predefined actions within a specified state. As a result, within a state machine providing for a new, shadow, or programmable state, in some embodiments, logic is provided to perform a defined set of operations for the new, shadow, or programmable state.

Also note that predefined state transitions within the FSM are also programmable, in some embodiments. For example, conditions to cause state transitions are altered, such as new conditions being defined for going between the detect and configuration states, or preexisting states to transition between are changed for the same condition, such as going from a detect state to a recover state upon the same condition that previously caused a transition from the detect state to the configuration state.

These components 200, 300, 400 of the system 350 are involved in I/O training and equalization operations. Hard-coded logic within each state machine is responsible for verifying that equalization completes successfully. If the equalization does not complete successfully, the system 350 is "downgraded", such as by operating at a lower speed than originally envisioned in the design.

With this approach, fixed transitions between FSM states that contain interaction with adaptive analog circuitry do not have the option for adjusting their transitions. Hence, the specific problem addressed by the programmable LTSSM 100 lies within the domain of the analog logic to FSM controls.

Figure 6:
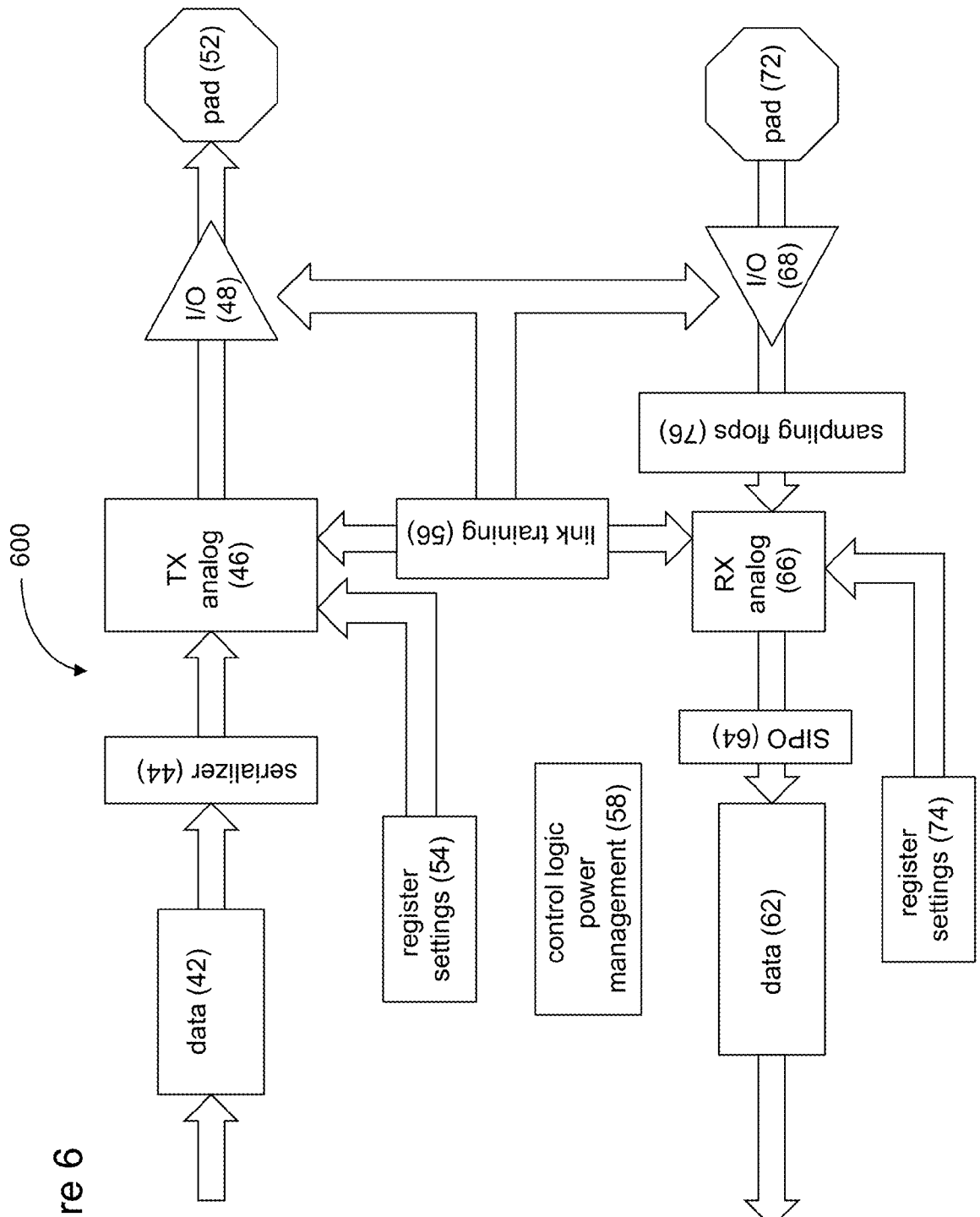
FIG. 6 is a functional block diagram of a receive path and a transmit path within the same device, according to some embodiments.

FIG. 6 is a block diagram of a transceiver 600, according to some embodiments. At a high level, FIG. 6 shows a general functional block diagram of the receive path and transmit path within the transceiver 600. Transmit data 42 is serialized by serializer 44 and sent through equalization logic (TX analog 46) and out the I/O 48 to the pad 52. Receive data 62 is received at the pad 72 and I/O 68, sampled by the sampling flip-flops 76, and sent through equalization circuitry (RX analog 66) and converted to parallel data 62 before being transmitted. In transmitting the data 62, the data passes through the physical layer, which is the circuit 600, and is processed by other layers of the protocol stack before being transmitted to a remote receiver.

The link training block 56, disposed between the transmit side and the receive side, represents the FSM's transaction controlling activity. The link training block 56 is built on a modularized transmit/receive path, with configurable equalization options. The configuration to control such parameters is represented as register settings 74, which sets the equalization behavior. In some embodiments, the programmable LTSSM 100 resides in the link training module 56 of the system 600.

In some embodiments, the programmable LTSSM 100 of FIG. 4 proposes the use of partitioned modules such that the core analog features contain key signals with a defined interface to the logic region. To begin, the programmable LTSSM 100 identifies the standard analog functions expected and partitions predefined control signals of the FSMs, such that equalization training algorithms and such are controllable on a "lane by lane" basis, through an embedded micro-controller at the platform level, in some embodiments. The programmable LTSSM 100 targets a programmable FSM that will have pre-specified/designed in programmability, low overhead in gate count, with extra power mainly due to gate leakage.

In some embodiments, the programmable LTSSM 100 is superior to using an on-die field-programmable logic array (FPLA), as the FPLA experiences a limited range of signal controllability, based on input and output signals available. Further, use of the FPLA is not conducive to small handheld devices, because the FPLA needs to be on at all times to enable the correct signaling behavior.

Within the circuit 600 (FIG. 6), the control logic, shown as control logic power management 58, is partitioned such that some of the logic is contained in an embedded controller. This enables software to configure (tweak) the final implementation of a design, based on I/O performance seen in silicon. This can be applicable to various communication technologies such as PCie, Common System Interface (CSI), wireless, etc.

Figure 7:
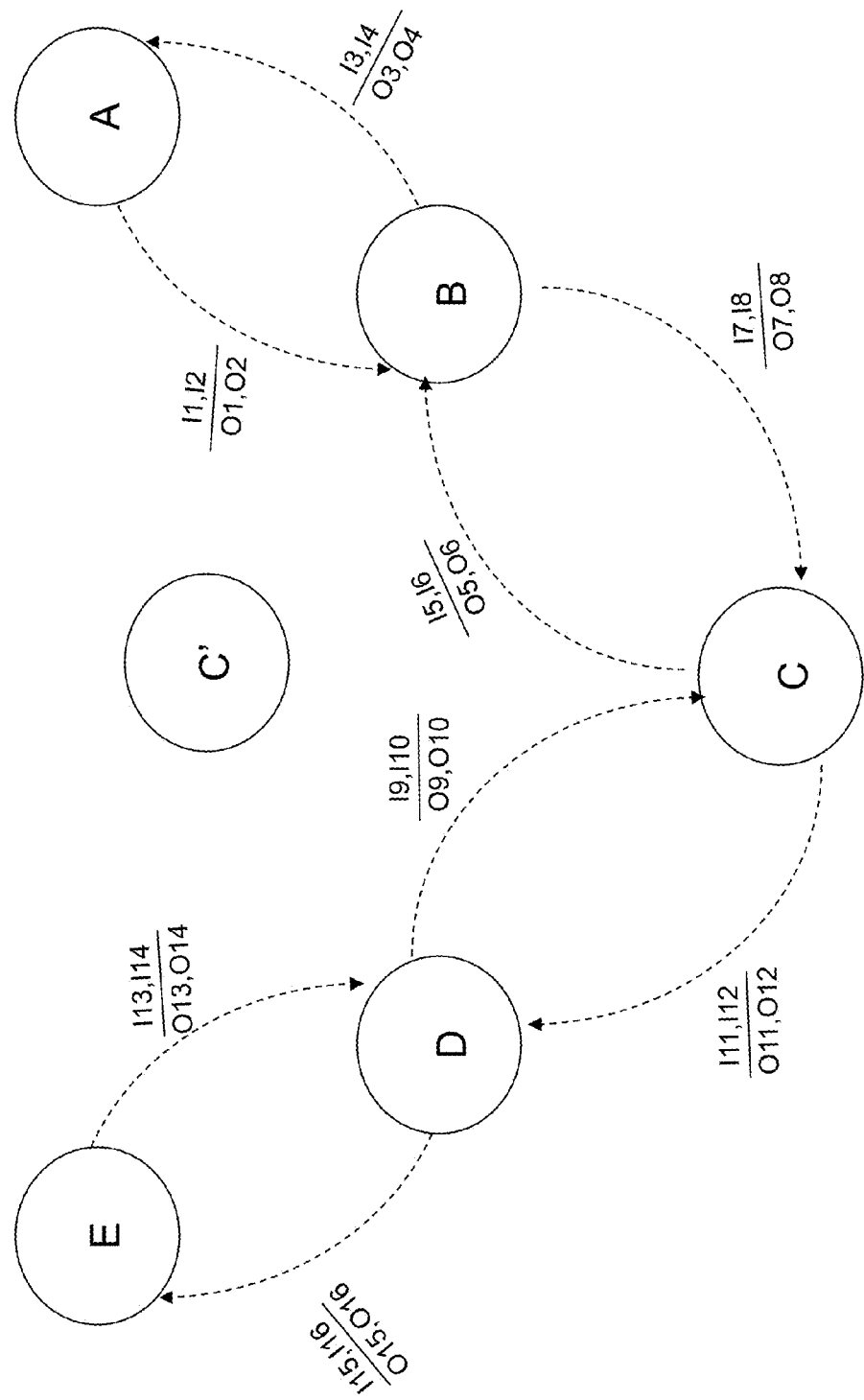
FIGS. 7-9 are state machine diagrams to illustrate how the shadow states of FIG. 4 operate, according to some embodiments.

FIG. 7 is a simplified FSM 700, used to show how the shadow states 150 of the programmable LTSSM 100 of FIG. 4 operate, according to some embodiments. The FSM 700 includes five regular states, A, B, C, D, and E, and one shadow state, C', where the shadow state is only intended to replace state C and no other states. The extra programmable state, C', may be used for both the debugging of the new silicon device embodying the system design or to re-program the outputs of offending signals, depending on the pre-programmed design features built-in. In some embodiments, the LTSSM 100 enables system designers an additional mechanism by which to get the system to market more quickly.

Each state transitions to another state, based on predefined inputs, denoted "xI" and "yI", for integers x and y, and predefined outputs, denoted "xO" and "yO" to distinguish the states. In the example, there are two inputs and two outputs for each state transition, but the principles described herein are applicable to FSMs having any number of inputs and outputs. Although the inputs and outputs are shown having like numbers, "I13,I14" and "O13,O14" for a transition between states E and D, for example, the inputs and outputs are not typically related to one another.

When the FSM 700 is in state C and input I11 or I12 is received, the FSM transitions to state D. Outputs O11 and O12 represent possible output signals generated to achieve a targeted design outcome while in the next state D. The FSM 700 is thus designed to represent the operation of a system under design.

Figure 8:
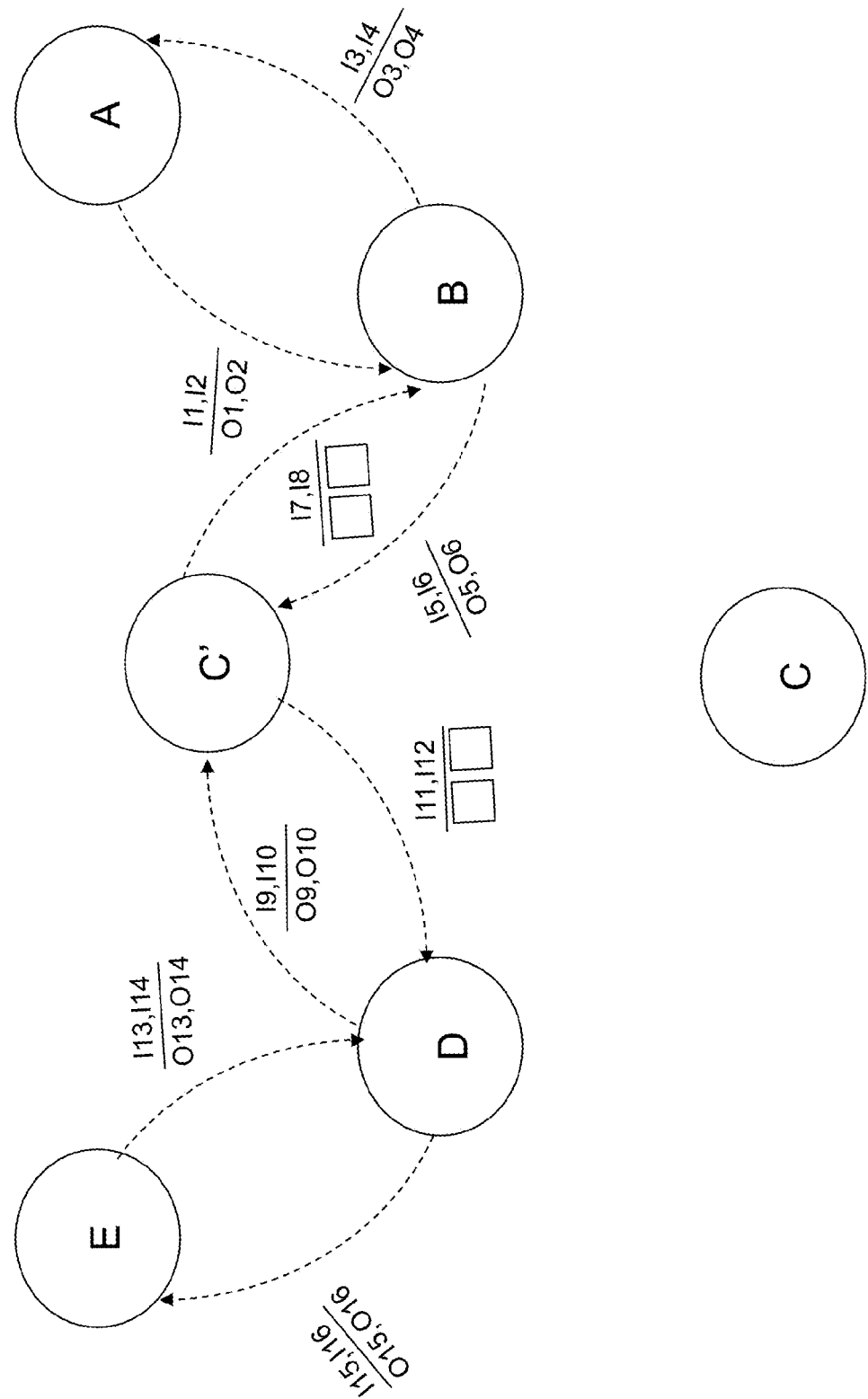

FIG. 8 shows the simplified FSM 700A, this time with state C being replaced by the shadow state, C'. Because state C has been replaced by state C', the outputs are defined differently than in the original FSM 700 (FIG. 7). By having a shadow state, C', the designer of a system that is represented by the FSM 700 is able to design flexibility into the system. By changing the state from C to C', the system designer is able to control/correct the output(s), in some embodiments.

There are several conditions or circumstances that trigger the replacement of the legacy state, C, with new state, C', in some embodiments. As one example, an original condition to exit a state is falsely triggered by some other support logic. A possible solution is to replace the legacy state with the new state, where the new state either removes the condition or further qualifies the condition to work around the false trigger. As another example, the original state fails to drive the proper triggers to other support logic. In this case, the legacy state would be replaced with the new state, with the new state having an additional output condition.

Another example may be that the original condition to exit a state is lingering in that state longer than is expected. This may be due to an unanticipated issue that is only realized during post-silicon debug of the system. The legacy state, C, may be replaced with the new state, C', where the new state includes a local state counter to monitor, remove the condition, or qualify the condition and work around it.

Figure 9:
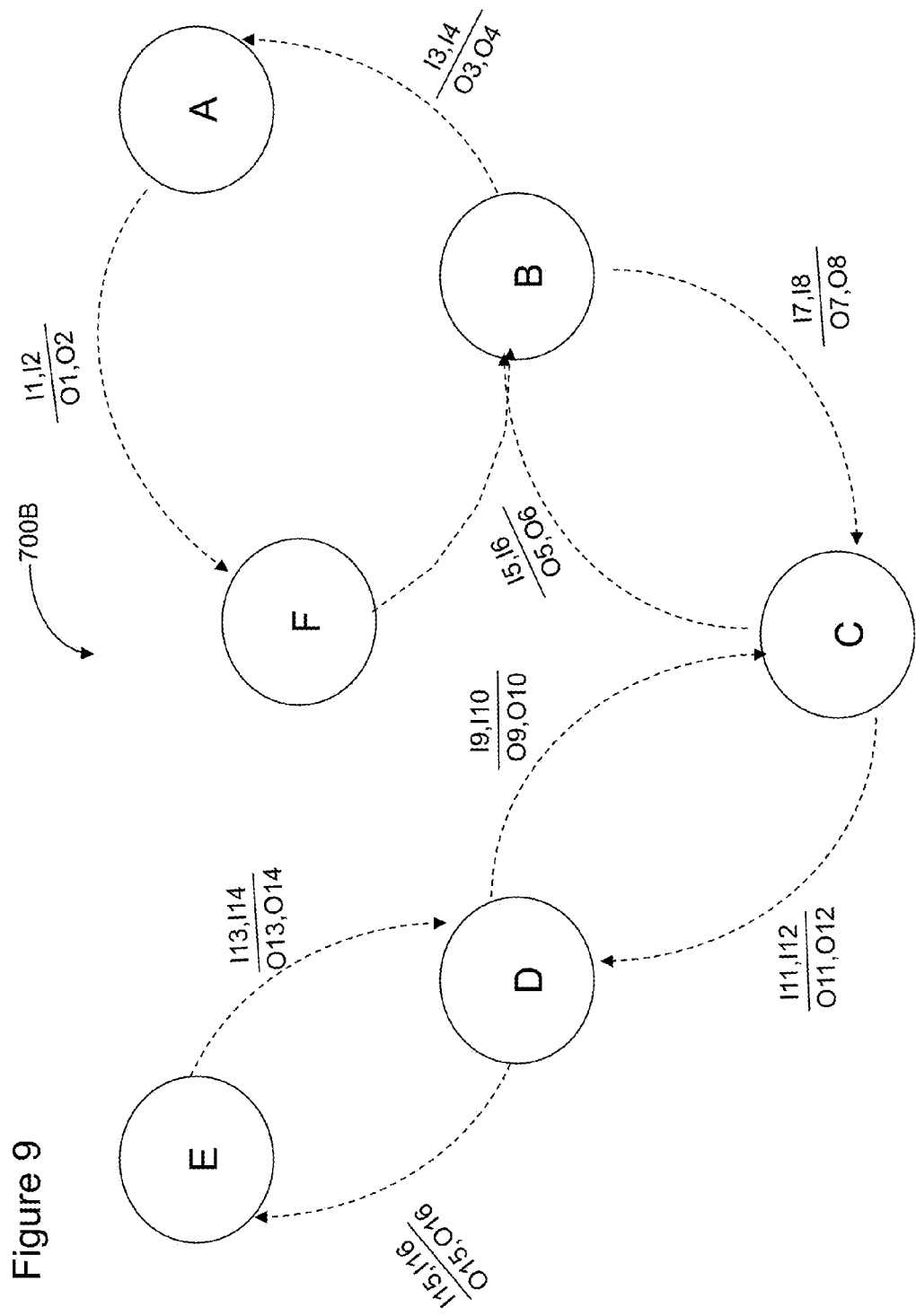

As yet another example, suppose that, during post-silicon debug of a part, the designers realize that the FSM requires an extra step between two existing steps. In the FSM 700 (FIG. 7), for example, if a step is needed between states A and B, the state transition from A to B would be replaced with a transition from A to F, then there would be a transition from state F to B, as illustrated in the FSM 700B of FIG. 9. In this example, state A is not replaced with a new state (A'), but, instead, a new state, F, is utilized as an additional state.

In some embodiments, the above examples are determined during post-silicon debug of the part. The problems may be identified as a specification compliance issue or miscommunication between system designers. The update of the FSM 700 as FSM 700B, where the state, F, is designed into the silicon in advance, enables the system designer to work around any adverse side effects of the device's operation.

Because the new states (C' in FIGS. 7 and 8 and F in FIG. 9) are part of the design and will be implemented in silicon, in some embodiments, they are designed to anticipate a number of different scenarios. In some embodiments, the new state is assigned to a group of states in the FSM. The new state can consume all of the inputs of the states in the group and can utilize and drive all of the outputs those states drive as well. Additionally, in some embodiments, the new state can consume additional undefined inputs and can drive additional undefined outputs, beyond those already present in the group of states.

For the LTSSM 100 (FIG. 4), the grouping of states may be as simple as one or two extra states per main state (polling, configuration, recovery, low-power states, disabled, hot reset). Or, the grouping may be a bit more specific, such as starting with a state grouping, but breaking up the more complicated states.

Returning to FIG. 4, the shadow states 150 represent a sub state hierarchy level (such as the generic FSM of FIG. 7) with an extra programmable state to replace with the correctable state. The correctable state logic can shadow any of the LTSSM main states; however, states detect 302, polling 304, configuration 306, and recovery 314 of the LTSSM 100 are of key interest. In some embodiments, the programmable LTSSM 100 provides an opportunity for control and programmability, which overrides state transitions, register settings, timers, and output signal behavior (such as to analog modules). Each state consists potentially of programmable signaling, registers, and state transfers, programmable timers, and latency counters.

The signal transitions in the LTSSM 100, for example, may be enabled or disabled with the new shadow state 150. Alternatively, the signal transitions may be multiplexed with a new signal. (Because of this, the outputs in FIG. 8 are not defined.) Nevertheless, the programmable LTSSM 100 has the capacity to modify signal transitions, which may be useful for testing, debugging, and for using a circuit in multiple generations of products, each with potentially different signaling requirements, clock rates, processing speeds, and so on.

Register settings within the replacement shadow state 150 of the LTSSM 100 may be programmed differently than with the original design. Similarly, sub-state transitions may be redirected or allowed to cycle longer using the LTSSM 100. Such action would be utilized to extend time for analog decision circuitry to properly complete or bypass an unexpected stall situation within a state. The possible uses of the programmable LTSSM 100 during testing, debugging, and new product development are myriad.

In some embodiments, the programmable LTSSM 100 provides for design in correction capability at the silicon level, conducive for design flows, such as synthesis tools, validation tools, tester verification procedures, and platform optimization. Silicon debug experiments can be easily cross-checked by creating the transitions in register transistor logic (RTL) or other design modeling languages, as an alternative to engaging in costly and time intensive focused ion beam (FIB) efforts. FIB is a manufacturing technique in which an ion beam drills into silicon, such as to cut signal traces. FIB may be followed by a step to add metal material to connect between traces in the silicon material. FIB is used to physically modify a chip in order to test a proposed modification to the chip, prior to committing the design to the next round of manufacturing specifications. FIB is thus a way to test a design change prior to the design becoming a permanent feature in the next revision of the device. FIB may also be used to enable debug of the device with physical probes.

Further, since this corrective logic is within the programmable LTSSM 100, RTL vectors may be written out for testing to give confidence that the product requirements are being met. Vectors are a set pattern of inputs and expected outputs used to test a device. These patterns are typically driven by a testing machine, with the testing machine also sampling the chips' outputs to ensure proper operation.

In some embodiments, as the product matures, the programmable LTSSM 100 provides an opportunity to deliver platform optimization software as a product differentiator for the device optimization to operate in a variety of platforms. The shadow states are used by designers, original equipment manufacturers (OEMs), or even users, in some embodiments, to optimize the operation of the FSM for particular objectives.

While it is claimed that the programmable LTSSM 100 may satisfy most high-speed I/O designs in which designed in protection against gaps in architecture definition is desired, the programmable LTSSM 100 is also combined with the use of a FPLA, in some embodiments. The adaptation of the programmable state may be further enhanced to include/utilize limited signaling within the FPLA when prototyping new devices. Targeted selective signal changes then are reduced in number of signals to match limited number of input and outputs afforded with the use of an FPLA, with area and power a cost tradeoff.

In some embodiments, the programmable LTSSM 100 strategically targets predefined necessary controls and partitions FSM controls such that they are configurable and driven by an embedded controller. This arrangement allows I/O signaling optimization to be configurable at the platform level for adjustments other than ranges and offsets.

Figure 10:
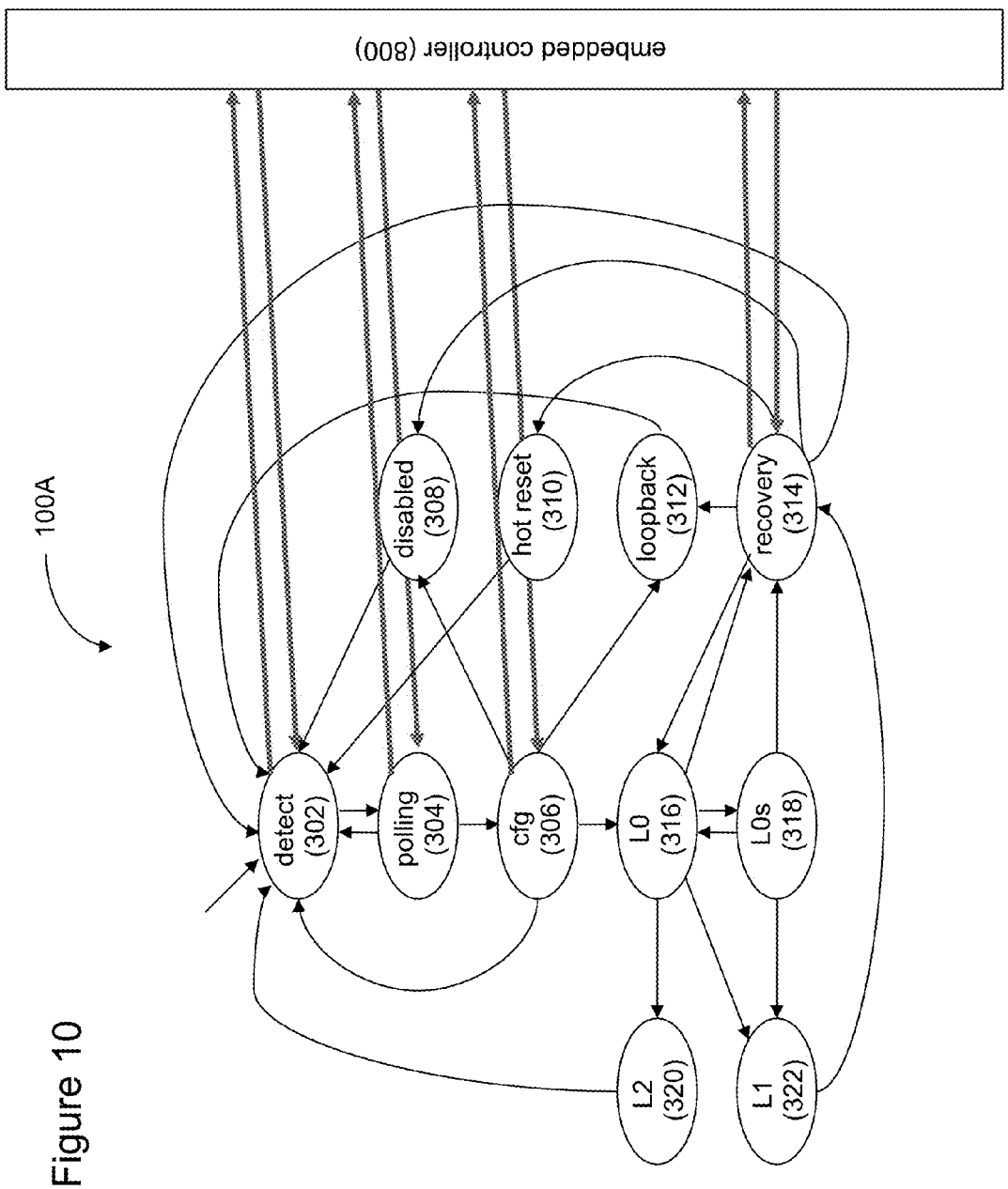
FIG. 10 is a simplified diagram showing the LTSSM of FIG. 1 with an embedded controller, according to some embodiments.

Thus, the programmable LTSSM 100 does strategic control signal handling that can be designed/configured so as to be conducive for design flows, such as synthesis tools and validation tools, as well as tester verification procedures. FIG. 10 is a second programmable LTSSM 100A, this time with an embedded controller 800 operating as the corrective logic, with the embedded controller controlling the detect 302, polling 304, configuration 306, and recovery 314 states, according to some embodiments. There are no shadow states in the programmable LTSSM 100A. Instead, the embedded controller 800 controls the transitions from the four states 302, 304, 306, and 314. The red lines are showing how the FSM can be linked to a light-weight microcontroller to add flexibility to its operation. In some embodiments, the microcontroller adjusts the conditions to enter/exit states and the control outputs of the states.

The shadow states 150 of the LTSSM 100 (FIG. 4) or the embedded controller 800 of the LTSSM 100A (FIG. 10) are the corrective logic that enables the behavior of some states of the LTSSM to change, based on changing system requirements. In the first example, the shadow states 150 replace the legacy states of the state machine. In the second example, the embedded controller 800 adjusts the conditions needed to enter and/or exit one or more states of the state machine.

Figure 11:
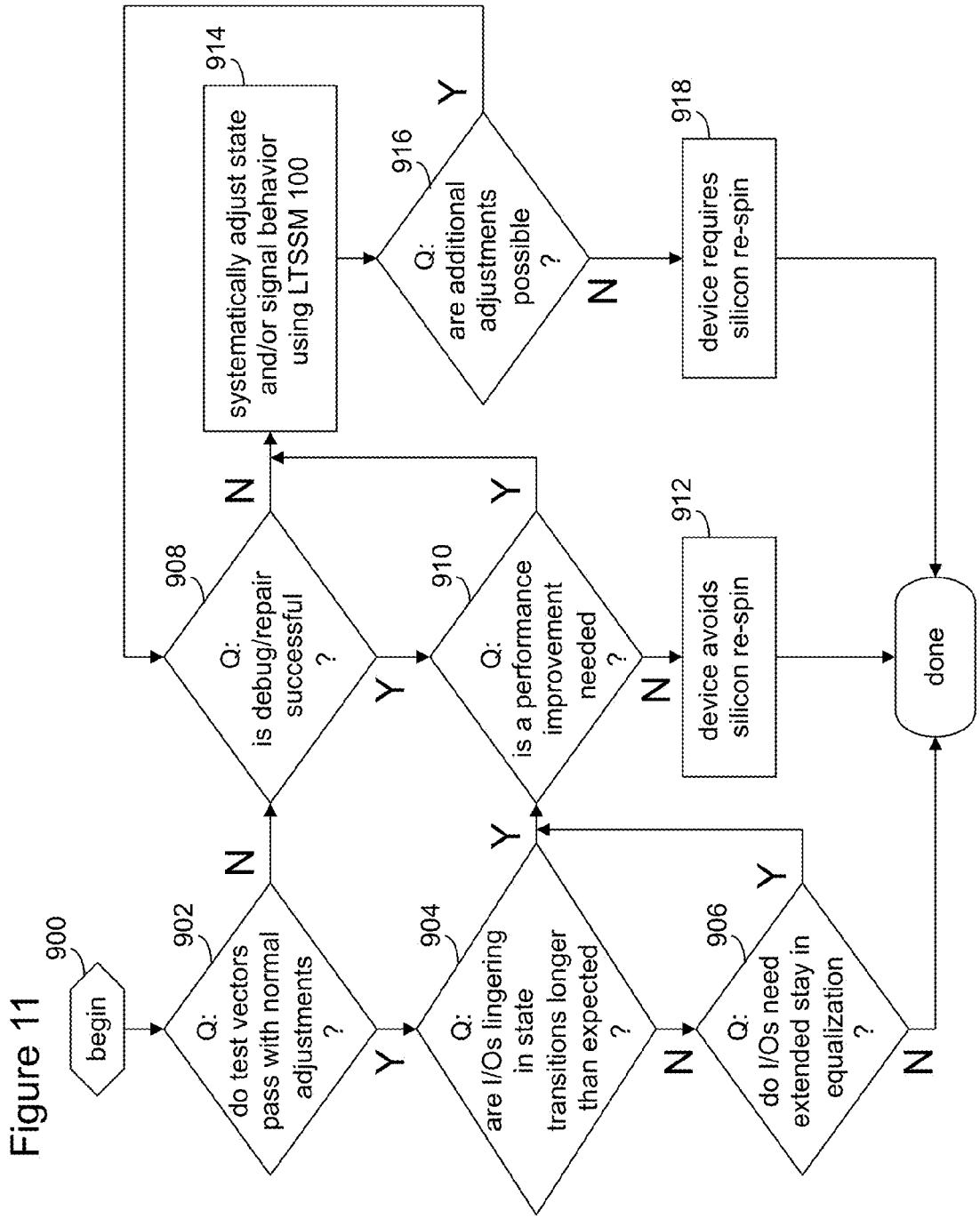
FIG. 11 is a flow diagram showing operations performed to invoke the LTSSM of FIG. 4, according to some embodiments.

FIG. 11 is a flow diagram showing a method 900 by which the LTSSM 100 of FIG. 4 may be invoked to facilitate system design, according to some embodiments. The system design may be any PCIe-compliant system, such as the transmitter 30 or the receiver 40 of the system 60. Further, there are several conditions in which the LTSSM 100 may be invoked, and these conditions are presented in a particular order in FIG. 11. Nevertheless, designers of ordinary skill in the art recognize that the steps depicted in FIG. 11 may be arranged in a different order. In particular, steps 902, 904, and 906 may be arranged in an order different than is shown.

During silicon testing of the system 60, any design defects that are uncovered are considered in the process flow. Thus, conditions such as whether the test vectors pass with normal adjustments (block 902), whether I/Os are lingering in state transitions longer than expected (block 904), or whether I/Os need an extended stay in equalization (block 906) may trigger use of the LTSSM 100. In the first case, where test vectors fail to pass with normal adjustments (block 902), there is an opportunity to first perform debug/repair (block 908) before invoking the corrective logic of the LTSSM 100 (block 914). If the debug/repair is successful (the "yes" prong of block 908), then, where a performance improvement is needed or desired (block 910), the LTSSM 100 may be invoked to systematically adjust state and/or signal behavior (block 914).

If, instead, the test vectors pass, but I/Os are lingering in state transitions longer than expected (the "yes" prong of block 904), as long as a performance improvement is not needed (block 910), a respin of the device silicon is avoided (block 912). However, if a performance improvement is needed or desired (which may be the case, since I/Os are in state transitions longer than expected), the LTSSM 100 may be invoked to adjust state and/or signal behavior (block 914). In this way, the LTSSM 100 enables the designer to make adjustments that may result in improved performance.

Finally, if there is no problem with the test vectors and no problem with I/O state transitions, there still may be a problem with the I/Os needing an extended stay during equalization operations (block 906). If this behavior does not frustrate the system design, that is, no performance improvement is needed (block 910), then the process is complete and no re-spin of the silicon is needed (block 912). If a performance improvement is preferred, the LTSSM 100 may be invoked to adjust signal and/or state behavior (block 914).

After the corrective logic of the LTSSM 100 is invoked due to any of these occurrences, if additional adjustments are possible (block 916), the system is again debugged or repaired (block 908), and the process begins anew. Otherwise, the programmable LTSSM 100 is unable to make sufficient adjustments to the system design, such that the system requires a re-spin of the silicon (block 918).

As the flow diagram 900 illustrates, the system design allows for debug/repair to take place (block 908), after which the LTSSM 100 may be invoked. This allows for designed in changes to be selected, with the ability to redirect sub-states and change output signals systematically. Retesting of the device allows determination and confirmation of the expected results. If the debug/repair is successful, the subsequent iterations may be exercised to improve device performance (block 910). The process 900 thus enables correction for "state lingering detection" (block 904), a behavior which can negatively impact performance, is difficult to predict before the system is committed to silicon, and is often not tested on the platform.

In some embodiments, the programmable LTSSM 100 builds in "design for correctability" features, such as the programmable FSM with embedded controller of FIG. 10, to enable software updates that enable silicon changes. The programmable LTSSM 100 thus enables device debug, device repair, avoids re-spins of the silicon device embodying the design, and improves the time-to-market on future high-speed I/O interfaces that utilize the original design. The programmable LTSSM 100 of FIG. 4 is designed so as to ease reliance on architecture definition additions late in the design cycle.

In some embodiments, the programmable LTSSM 100 also builds correctable interface behavior to analog regions. This includes (but is not limited to) the ability to change behavior of and within the detect 302, polling 304, configuration 306, and recovery 314 states, to enable flexibility in the analog signal interface.

Figure 12:
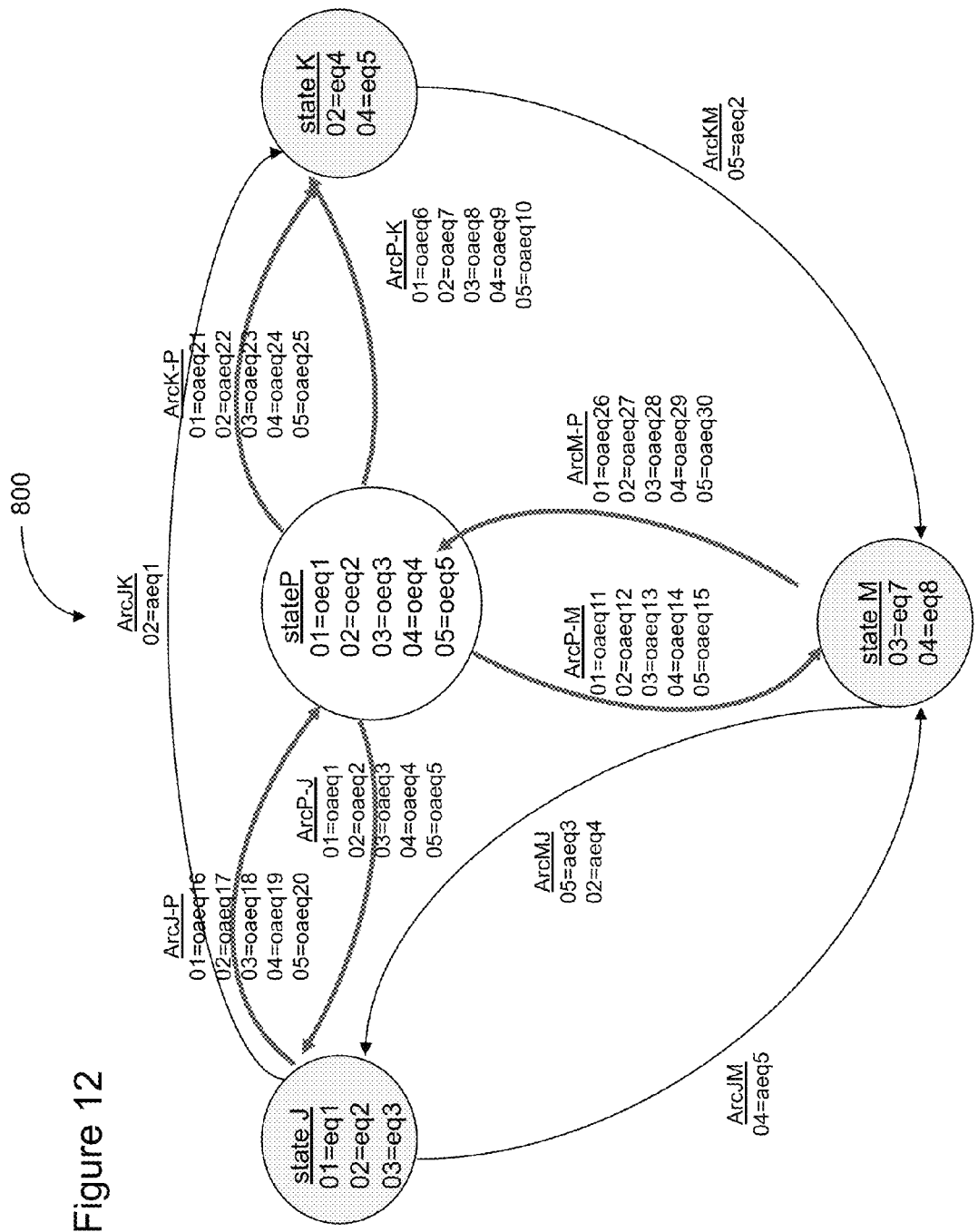
FIG. 12 is a state machine diagram showing the principles of the programmable LTSSM, according to some embodiments.

FIG. 12 is a diagram of a finite state machine 800 used to illustrate the principles of the programmable LTSSM 100, according to some embodiments. The finite state machine 800 is a three-state finite state machine with five outputs and an arbitrary number of inputs. The three states, J, K, and M (green) are the part of the original design of the state machine 800, while the middle state, state P, is the state that will fix the state machine 800 when needed.

In some embodiments, the following are natural functions of the finite state machine. Based on the current state and inputs, these functions are hard-coded:

$$eq\# \to f_\#(\text{state, inputs})$$
$$\text{Arc}^* \to f\,\alpha\omega(\text{state, inputs})$$
$$aeq\# \to f\,\alpha\#(\text{state, next\_state, inputs})$$

These functions used in the corrective logic, are derived from configuration registers in some embodiments. In other embodiments, these functions are derived from an FPLA:

$$oeq\# \to f_\#(\text{state, inputs})$$
$$\text{Arc}^*\text{-}^* \to f\,\alpha\omega(\text{state, inputs})$$
$$oaeq\# \to f\,\alpha\#(\text{state, next\_state, inputs})$$

In some embodiments, the Arc*-* function may be made to overrule the Arc* functions when doing state replacement. As one example, in FIG. 12, Arc J-P could be made to be similar by higher priority to ArcJK. then state P can be set up to be state K'. Where a new state is being inserted into the FSM (rather than replacing an older state), the Arc*-* equations can be designed to drop into the proper priority slot with the existing arcs also active.

Figure 13:
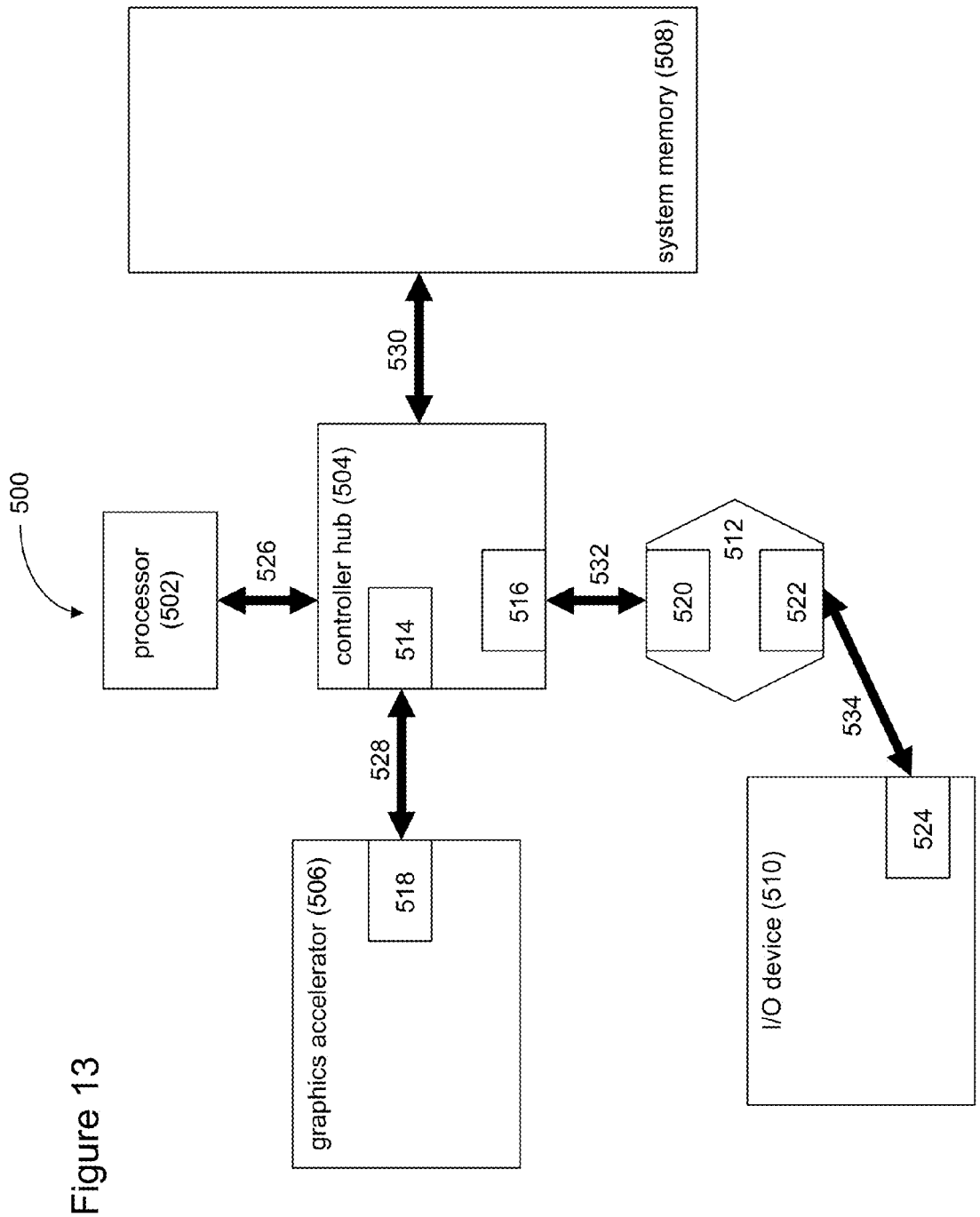
FIG. 13 is a simplified block diagram of a system including a serial point-to-point interconnect to connect I/O devices in a computer system, according to some embodiments.

FIG. 13 is a simplified block diagram of a system including devices coupled to a controller hub via a serial link, according to some embodiments. The system 500 includes a processor 502 and system memory 508 coupled to controller hub 504. Processor 502 includes any processing element, such as a microprocessor, a host processor, an embedded processor, a co-processor, or other processor. Processor 502 is coupled to controller hub 504 through a front-side bus (FSB) 526, also known as a direct media interface (DMI) bus. In some embodiments, the FSB 526 is a serial point-to-point interconnect, as described below.

System memory 508 includes any memory device, such as random access memory (RAM), non-volatile (NV) memory, or other memory accessible by devices in the system 500. System memory 508 is coupled to controller hub 504 through memory interface 530. Examples of a memory interface include a double-data rate (DDR) memory interface, a dual-channel DDR memory interface, and a dynamic RAM (DRAM) memory interface.

In some embodiments, the controller hub 504 is a root hub or root controller in a Peripheral Component Interconnect Express (PCIe) interconnection hierarchy. Examples of the controller hub 504 include a chipset, a memory controller hub (MCH), a northbridge, an interconnect controller hub (ICH) a southbridge, and a root controller/hub. Often, the term "chipset" refers to two physically separate controller hubs, i.e. a memory controller hub (MCH) coupled to an interconnect controller hub (ICH).

Here, controller hub 504 is coupled to switch/bridge 512 through serial link 532. Input/output modules 516 and 520, which may also be referred to as interfaces/ports 516 and 520, include/implement a layered protocol stack to provide communication between controller hub 504 and switch 512. A module, such as modules 516, 514, 520, 522, 524, and 518, may be implemented in hardware, software, firmware, or any combination thereof. Furthermore, module boundaries commonly vary and functions are implemented together, as well as separately, in different embodiments. In some embodiments, multiple devices are capable of being coupled to switch 512.

Switch 512 routes packets/messages from device 510 upstream, i.e. up a hierarchy toward a root controller, to controller hub 504 and downstream, i.e. down a hierarchy away from a root controller, from processor 502 or system memory 508, to device 510. Device 510 includes any internal or external device or component to be coupled to an electronic system, such as an I/O device, a network interface controller (NIC), an add-in card, an audio processor, a network processor, a hard-drive, a storage device, a CD/DVD ROM, a monitor, a printer, a mouse, a keyboard, a router, a portable storage device, a firewire device, a universal serial bus (USB) device, a scanner, and other input/output devices.

Graphics accelerator 506 is also coupled to the controller hub 504 through a serial link 528. In some embodiments, the graphics accelerator 506 is coupled to an MCH, which is coupled to an ICH. The switch 512, and accordingly, the I/O device 510, is then coupled to the ICH. I/O modules 518 and 514 are also to implement a layered protocol stack to communicate between the graphics accelerator 506 and the controller hub 504.

There are many different environments in which the programmable LTSSM 100 may be used to perform link training. In some embodiments, the programmable LTSSM 100 may operate to perform link training in a wired or wireless environment. The programmable LTSSM 100 may also perform link training in the FSB 526 between the processor 502 and the controller hub 504 (FIG. 13). The programmable LTSSM 100 may also perform link training in the memory interface 530 between the system memory 508 and the controller hub 504. The programmable LTSSM 100 may also perform link training in the serial link 528 between the graphics accelerator 506 and the controller hub 504. The programmable LTSSM 100 may also perform link training in the serial link 532 between the controller hub 504 and the switch/bridge 512.

Along with PCIe, a mobile industry processor interface (MIPI) is another serial interconnect protocol that focuses on power consumption. The MIPI protocol is thus suited to portable electronic devices in which power consumption is a concern. Along with the MIPI protocol, a new mobile physical layer (MPHY) specification has been defined.

An advanced microcontroller bus architecture (AMBA) is a specification for an on-chip bus used in system-on-chip designs. The AMBA protocol includes an advanced extensible interface (AXI), advanced high-performance bus (AHB), and an advanced peripheral bus (APB).

A quick path interconnect (QPI) is a specialized bus that is coupled between processors of a multiprocessor system. The QPI bus, specifically designed for processors, speed up communication between two processors.

A unified protocol known as UniPro is a high-speed protocol for interconnecting integrated circuits in mobile and other devices. A high-speed universal serial bus (USB) protocol, known as superspeed interchip (SSIC) protocol, brings the USB 3.0 specification from outside the processor-based system to communication between chips within the processor-based system.

The LTSSM 100 may be used to perform link training between a processor-based system and any device connected thereto, whether wired or wireless. Additionally, in some embodiments, the LTSSM is used to perform link training of various links within a processor-based system, whether the links utilize the PCIe protocol, the AMBA protocol with the AXI interface, the QPI protocol, the DMI protocol, the UniPro protocol, the SSIC protocol, and other protocol/specifications.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A programmable link training and status state machine (LTSSM) comprising:
    a plurality of states that are interconnected in a predefined arrangement, wherein an incoming signal moved from a first state of the plurality of states to a second state of the plurality of states is based on first predefined conditions, the first predefined conditions comprising:
        conditions to enter or exit the first state; and
        control outputs of the first state; and
    corrective logic to adjust one or more of the first predefined conditions, resulting in second predefined conditions, wherein the incoming signal moves from the first state to the second state based on the second predefined conditions;
    wherein the programmable LTSSM enables a transceiver to perform link training of a channel between the transceiver and a remote receiver.

2. The programmable LTSSM of claim 1, wherein the plurality of states comprise a detect state, a polling state, a configuration state, a disabled state, a hot reset state, a loopback state, a recovery state, an L0 state, an L0s state, an L1 state, and and L2 state.

3. The programmable LTSSM of claim 2, wherein the first state is the detect state.

4. The programmable LTSSM of claim 2, wherein the first state is the polling state.

5. The programmable LTSSM of claim 2, wherein the first state is the configuration state.

6. The programmable LTSSM of claim 2, wherein the first state is the recovery state.

7. The programmable LTSSM of claim 1, wherein the corrective logic comprises a shadow state, wherein the first state is replaced with the shadow state.

8. The programmable LTSSM of claim 1, wherein the corrective logic comprises an embedded controller to adjust the first conditions.

9. The programmable LTSSM of claim 1, wherein the transmitter is Peripheral Component Interconnect Express (PCIe)-capable.

10. The programmable LTSSM of claim 1, wherein the link training is performed in a front-side bus between a processor and a controller hub of a processor-based system.

11. The programmable LTSSM of claim 1, wherein the link training is performed in a memory interface between a system memory and a controller hub of a processor-based system.

12. The programmable LTSSM of claim 1, wherein the link training is performed in a serial link between a graphics accelerator and a controller hub of a processor-based system.

13. The programmable LTSSM of claim 1, wherein the link training is performed in a serial link between a controller hub and a switch/bridge of a processor-based system.

14. A transceiver, comprising:
a serializer to receive first data, wherein the first data is transmitted by a remote receiver to the transceiver across a first channel;
transmit analog equalization logic coupled to the serializer to convert the first data to analog data;
receive analog equalization logic to convert second data to digital data, wherein the second data is to be transmitted to a second remote receiver across a second channel; and
a link training module disposed between the transmit analog equalization logic and the receive analog equalization logic, the link training module comprising a link training and status state machine (LTSSM), wherein the link training module, during link training:
activates a new state within the LTSSM as a result of a condition occurring in a legacy state of the LTSSM; and
completes the link training.

15. The transceiver of claim 14, the LTSSM in the link training module further comprising:
a detect state, a polling state, a configuration state, a disabled state, a hot reset state, a loopback state, a recovery state, a L0 state, a L0s state, a L1 state, and an L2 state.

16. The transceiver of claim 15, wherein the legacy state is selected from a group consisting of the detect state, the polling state, the configuration state, and the recovery state.

17. The transceiver of claim 15, the link training module further comprising:
an embedded controller to activate the new state.

18. A programmable state embedded in a link training and status state machine (LTSSM) of a logical sub-block of a transmitter, the programmable state comprising:
a plurality of inputs coinciding with valid inputs of one or more other states of the LTSSM;
a plurality of outputs coinciding with valid outputs of the one or more other states of the LTSSM;
a new input; and
a new output;
wherein the programmable state is activated in response to the LTSSM encountering an undesirable condition in the transmitter during link training.

19. The programmable state of claim 18, wherein the undesirable condition in the transmitter comprises a first state of the one or more other states exiting due to a false trigger received by support logic;
wherein the programmable state replaces the first state in the LTSSM of the transmitter.

20. The programmable state of claim 18, wherein the undesirable condition in the transmitter comprises a first state of the one or more other states failing to drive an expected trigger to support logic;
wherein the programmable state replaces the first state in the LTSSM of the transmitter.

21. The programmable state of claim 18, wherein the undesirable condition in the transmitter comprises a first state failing to exit within a predetermined time period;
wherein the programmable state replaces the first state in the LTSSM of the transmitter.

22. The programmable state of claim 18, wherein the undesirable condition in the transmitter comprises a missing step in the LTSSM;
wherein the programmable state is added after a first state of the one or more states in the LTSSM of the transmitter.

23. The programmable state of claim 18, wherein the one or more other states of the LTSSM of the transmitter comprise a detect state, a polling state, a configuration state, and a recovery state.

24. The programmable state of claim 23, wherein the one or more other states of the LTSSM of the transmitter further comprise an L0 power state, an L0s power state, an L1 power state, and an L2 power state.

25. An apparatus comprising:
a transmit path to transmit data on an interconnect fabric;
a receive path to receive data on the interconnect fabric;
a link training module to provide a path between the transmit path and the receive path;
a detect state;
a polling state coupled to the detect state; and
a configuration state coupled to the detect state;
wherein the link training module is to transition from a first state of the link training module to a second state of the link training module in response to a condition, and wherein the link training module is programmable to transition from the first state of the link training module to a third state of the link training module in response to the condition.

26. The apparatus of claim 25, wherein the first state is the detect state and the second state is the polling state.

27. The apparatus of claim 25, wherein the first state is the polling state and the second state is the configuration state.

28. The apparatus of claim 25, wherein the first state is the detect state and the second state is the polling state.

29. The apparatus of claim 25, wherein the first state is the configuration state and the second state is the detect state.

30. The apparatus of claim 25, wherein the third state is a modification of the second state.

31. The apparatus of claim 25, wherein the third state is not a modification of the second state.

* * * * *